United States Patent
Remsburg

Patent Number: 6,052,274
Date of Patent: Apr. 18, 2000

[54] FASTENER FOR BRACKET ALIGNMENT AND TEMPORARY SUPPORT

[75] Inventor: Ralph Remsburg, Austin, Tex.

[73] Assignee: Dell USA, L.P., Round Rock, Tex.

[21] Appl. No.: 09/153,283

[22] Filed: Sep. 15, 1998

[51] Int. Cl.$^7$ ................................................ G06F 1/16
[52] U.S. Cl. ........................ 361/683; 361/727; 411/42; 411/182; 411/386
[58] Field of Search ........................... 361/683, 727; 312/223.2; 411/508, 509, 510, 42, 178; 211/26, 182

[56] References Cited

U.S. PATENT DOCUMENTS

| | | | |
|---|---|---|---|
| 3,599,686 | 8/1971 | Peebles | 145/46 |
| 3,668,968 | 6/1972 | Modrey | 85/83 |
| 3,748,696 | 7/1973 | Martin | 24/16 PB |
| 3,893,365 | 7/1975 | Gross | 85/80 |
| 4,043,247 | 8/1977 | Rowinski | 85/31 |
| 4,100,748 | 7/1978 | Hansen | 61/45 B |
| 4,304,083 | 12/1981 | Anderson | 52/509 |
| 4,449,338 | 5/1984 | Reicherts | 52/127.8 |
| 4,557,649 | 12/1985 | Jeal | 411/40 |
| 4,587,377 | 5/1986 | Rodseth | 361/702 |
| 4,640,639 | 2/1987 | Matsui | 403/24 |
| 4,706,437 | 11/1987 | Boecker, Jr. | 52/698 |
| 4,753,561 | 6/1988 | Betterton et al. | 411/182 |
| 4,924,355 | 5/1990 | Mitchell et al. | 361/415 |
| 4,973,212 | 11/1990 | Jacobs | 411/508 |
| 4,978,265 | 12/1990 | De Wan | 411/60 |
| 5,052,861 | 10/1991 | Hipkins, Sr. | 405/261 |
| 5,138,525 | 8/1992 | Rodriguez | 361/390 |
| 5,199,149 | 4/1993 | Matsuura | 411/510 |
| 5,331,507 | 7/1994 | Kyung et al. | 361/720 |
| 5,413,833 | 5/1995 | Hernandez et al. | 428/119 |
| 5,452,184 | 9/1995 | Scholder et al. | 361/799 |
| 5,519,169 | 5/1996 | Garrett et al. | 174/35 R |
| 5,558,479 | 9/1996 | McElderry | 411/178 |
| 5,620,287 | 4/1997 | Pratt | 411/43 |
| 5,647,748 | 7/1997 | Mills et al. | 439/81 |
| 5,680,293 | 10/1997 | McAnally et al. | 361/685 |
| 5,791,498 | 8/1998 | Mills | 211/26 |

OTHER PUBLICATIONS

U.S. Patent Application No. 08/503,347 entitled "Ceramic Substrate Having Metallized Through–Hole Inserts And Methods Of Operation And Manufacture Thereof," by inventor H. Scott Estes, filed Jul. 17, 1995.

*Primary Examiner*—Leo P. Picard
*Assistant Examiner*—John D. Reed
*Attorney, Agent, or Firm*—Skjerven, Morrill, MacPherson, Franklin & Friel, L.L.P.; Stephen A. Terrile

[57] ABSTRACT

A fastener temporarily attaches articles through aligned apertures in the articles including a nut plate allowing the articles to be assembled by one assembler. The fastener has a flange, a cylindrical sleeve, and a solid pin. The flange ensures that the fastener does not pass completely through the aligned apertures. The sleeve supports articles and couples with the flange on one end of the sleeve and the solid pin on the other end of the sleeve. The solid pin can support a nut plate and further engages the threads in the nut plate through friction. The juncture between the sleeve and the solid pin is formed to allow the pin to break away from the cylindrical sleeve when pressure is applied. A screw or other threaded fastener is inserted through the cylindrical sleeve and pressed against the solid pin. Once the solid pin breaks away, the threads on the screw engage with the corresponding threads on the nut plate. The flange coupled to the cylindrical sleeve engages with the head of the screw and acts as a washer to prevent the screw from disengaging from the articles. A second flange can be used to further secure the fastener to the articles by passing through one or more of the apertures and springing back to prevent the fastener from slipping out of the apertures.

24 Claims, 7 Drawing Sheets

FASTENER FOR BRACKET ALIGNMENT AND TEMPORARY SUPPORT

BACKGROUND

1. Field

This field relates to supporting articles while the articles are being attached to a structure.

2. Description of the Related Art

A challenge of component manufacturers, especially with respect to rack mounted components, relates to holding one or more components in one hand, aligning holes located on the components, and placing and screwing a screw with the other hand.

It is desirable to avoid employing two people to perform assembly operations at a given assembly station. However, two people are often needed so that one person can hold the components and align the holes while the other person can aligned the screw and operated the screw driver to screw the screw through the holes to attach the components to one another. This is exacerbated when the weight or dimensions of the components is increased, making it increasingly difficult to hold and align the holes with one hand. Assemblers and others have attempted to overcome this issue in various ways.

One solution that enables one person to attach the components to one another without assistance is to hold the components together and use a spring clamp to temporarily hold the components to one another. Once the spring clamp is in place, the assembler uses one hand to align the screw and the other hand to screw the components together. One obstacle faced by this solution is that components may be of various size, shape, and weight that may make it difficult to find a suitable place for attaching the clamp. For example, if a flat square panel is to be affixed to an angle bracket through a hole in the center of the panel, a clamp would have to have very long jaws to extend across the panel surface to the place where the bracket is to be affixed. One person could not easily hold the components together and operate a clamp of this size. Another obstacle faced by this solution is that greater spring tension is needed in the clamp to hold heavier components together. Increased tension in the spring clamp again makes it increasingly difficult for a single person to operate. In addition, in a manufacturing setting, injuries could result from repetitively engaging a clamp with sufficient tension, thus frustrating the efficiency and productivity goals of the manufacturing operation. Finally, slippage between the components can occur when components are heavier or when more than two components are clamped together and component surfaces are smooth, oily, or otherwise slippery.

Another solution is a holding means which temporarily holds the fastener in place while being fastened. Such a solution could be as simple as a piece of masking tape placed over the hole in the first component and the screw inserted through the masking tape to hold the screw temporarily while the components are being aligned. Solutions also exist for holding small fasteners which, because of their size, are difficult to grasp with fingers and either strike with a hammer or engage with a screw driver. One difficulty with using a temporary holding means is that the holding means does not assist in keeping the components together, so the assembler still needs to manually align the holes on the various components before engaging the fastener. The alignment of the holes is further frustrated by the fact that the holding means might block the view of the holes. Accordingly, a fastener is needed which can quickly be inserted through the holes of components and temporarily support the assembly until a screw is inserted into the fastener to provide increased strength and support.

FIGS. 1A–1C depict components used to assemble components of a rack mounted computer system. FIG. 1A depicts nut plate 110 which includes a plurality of threaded apertures. FIG. 1B depicts recessed slide 120 which, as shown, is about to be fastened to a portion of rack 150 using nut plate 110 and screw 170. The rack 150 further includes rail edge 160 which contains a plurality of apertures for attaching recessed slide 120. Recessed slide 120 is first attached to mounting bracket 130 which includes a flange 140 for attaching the mounting bracket 130 to rack 150. FIG. 1C illustrates the components in an assembled state with screw 170 attaching rail edge 160 to flange 140 by engaging threads within an aperture of nut plate 110 (not shown).

SUMMARY

The fastening mechanism of the present invention has the advantages of simplifying the assembly of multiple components to one another. The present invention provides a fastener that is engaged by inserting the fastener through the holes of two or more components that need to be attached. The fastener contains a flange to prevent the fastener from completely entering the holes in the components. Coupled to the flange is a hollow sleeve through which a second fastener, such as a screw, can be inserted. A solid pin is coupled to the sleeve at the end opposite the flange. Once the fastener is in place, the components are further secured by placing a second fastener, such as a screw, in a hollow sleeve portion of the fastener. Once the screw reaches the end of the hollow sleeve portion of the fastener, it presses against and causes a solid pin to de-couple from the end of the fastener. The juncture between the pin and the sleeve is responsive to pressure and allows the pin to de-couple from the sleeve. After the pin is de-coupled, the flange and sleeve portion of the fastener remain with the assembly

BRIEF DESCRIPTION OF THE DRAWINGS

The present invention may be better understood, and its numerous objects, features, and advantages made apparent to those skilled in the art by referencing the accompanying drawings.

FIG. 6B is a cross-sectional view of a fastener along the line 6B—6B of

FIG. 6A according to the present invention.

The use of the same reference symbols in different drawings indicates similar or identical items.

DETAILED DESCRIPTION

Figure 1A:
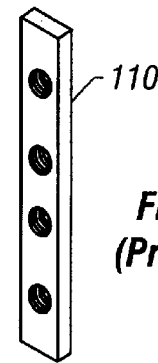
FIG. 1A (labeled prior art) is a perspective view of a nut plate.
Figure 1B:
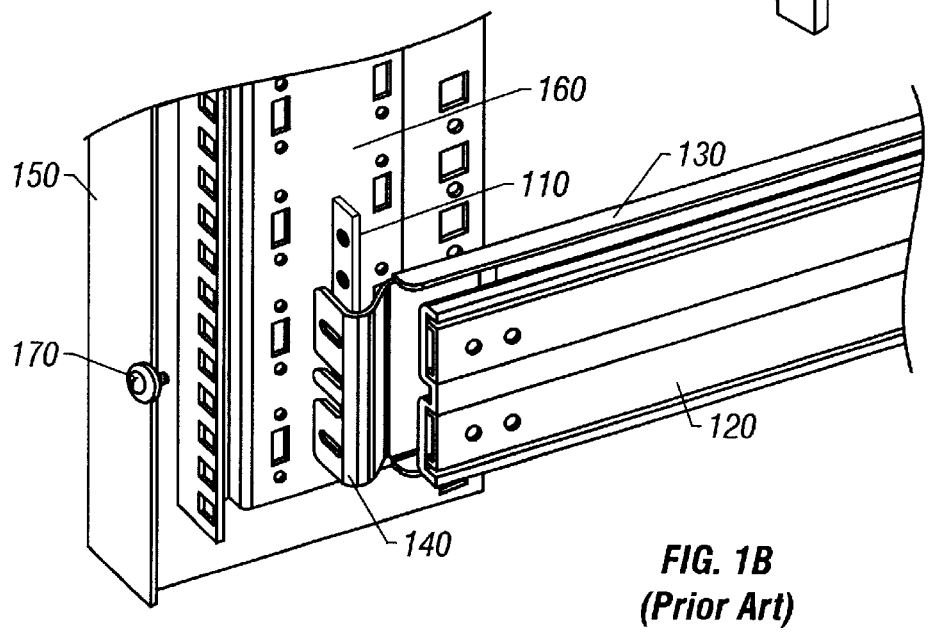
FIGS. 1B and 1C (labeled prior art) illustrate partial views of a rack mounting mechanism using the nut plate illustrated in FIG. 1A.
Figure 1C:
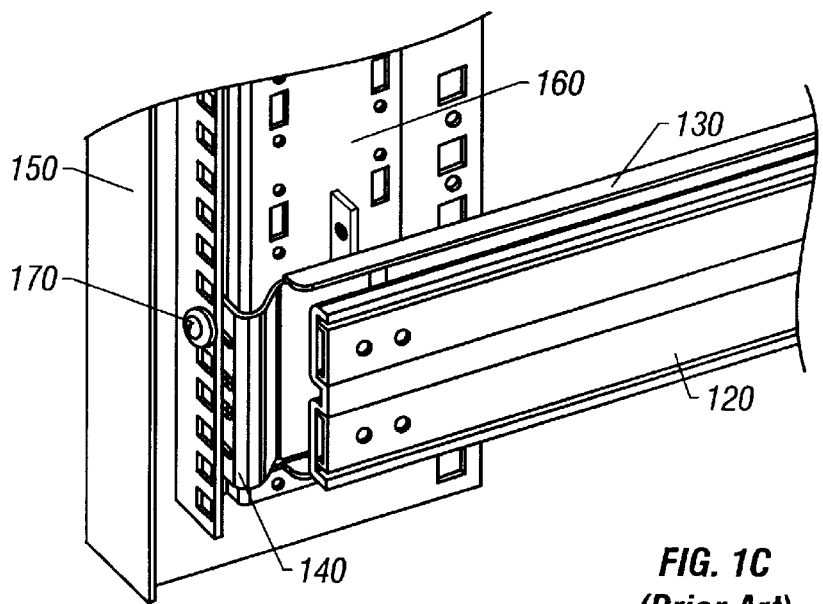
Figure 2A:
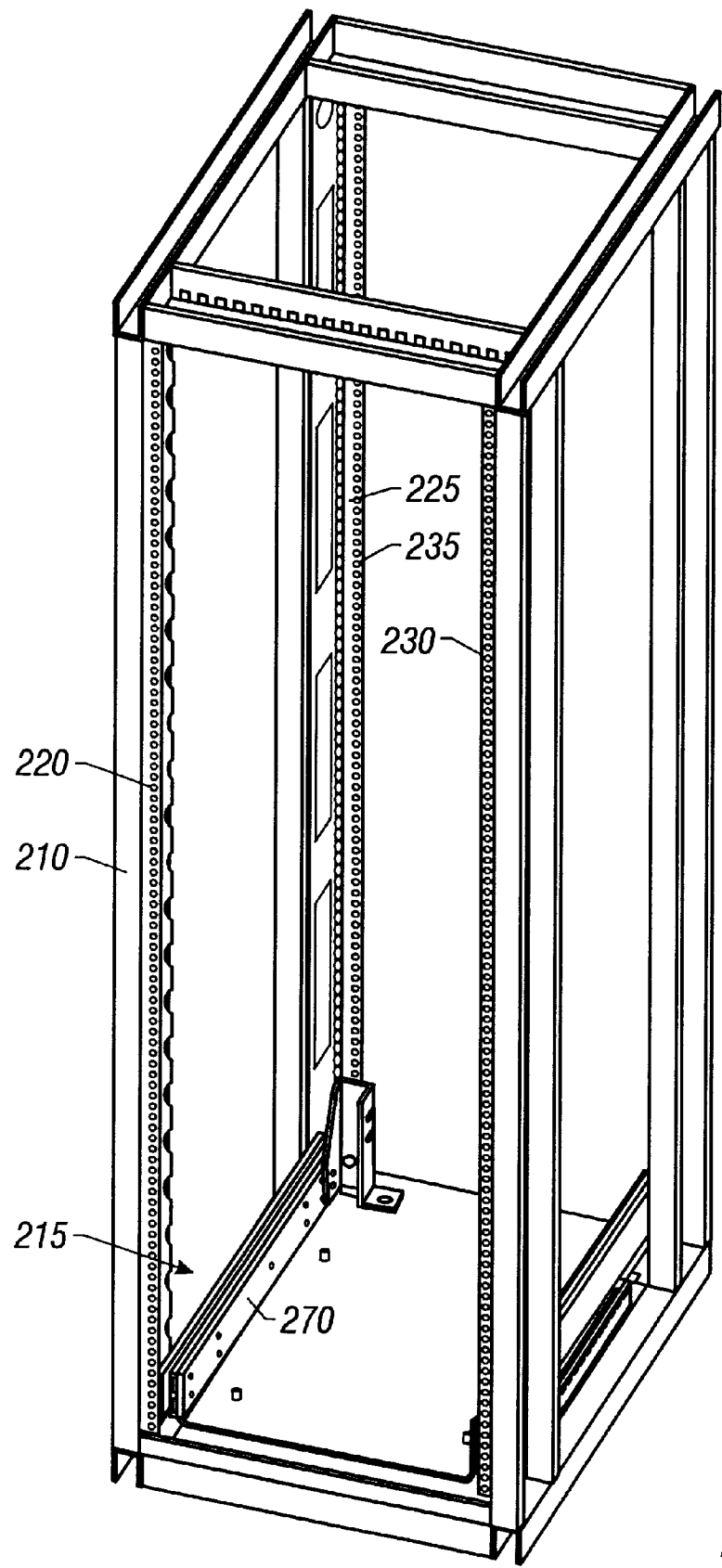
FIGS. 2A AND 2B illustrate a rack and rack mounted computer system.
Figure 2B:
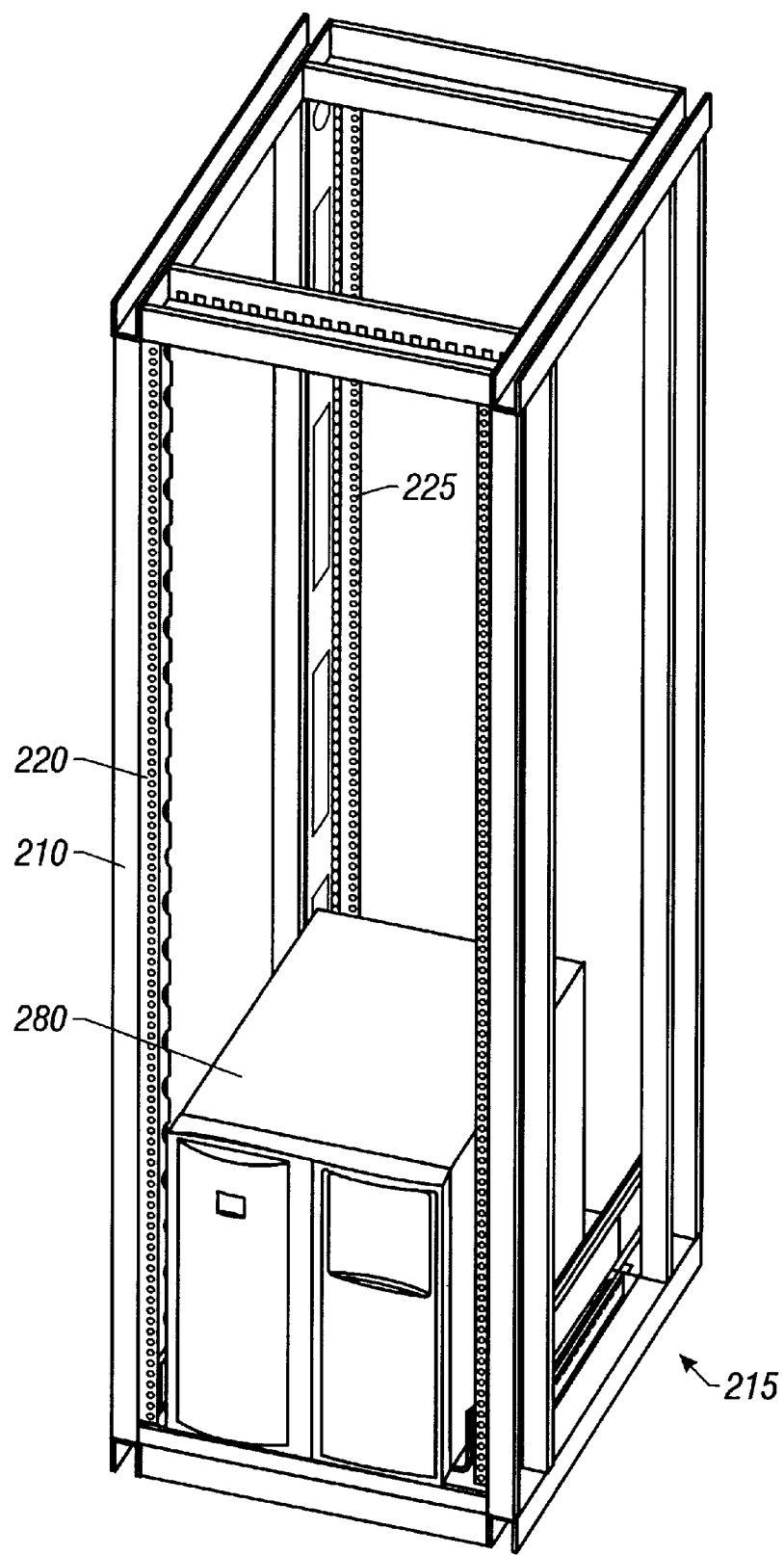

A rack mounted computer system of the present invention is shown in FIGS. 2A–2B. FIG. 2A shows rack 215 which includes frame 210. Frame 210 includes front rail 220 extending vertically on both the left and right side of the front of frame 210 and a back rail 225, extending vertically on both the left and right side of the back of frame 210. Each rail (220 and 225) has an edge, respectively, front edge 230 and back edge 235. The front edge 230 extends perpendicularly outward from the base of the front rail 220, while the back edge 235 extends perpendicularly outward from the base of the back rail 225. FIG. 2A also shows a recessed slide 270 which extends horizontally from the front edge 230 to the back edge 235.

FIG. 2B shows computer system 280 which has been mounted horizontally in rack 215 with use of recessed slide 270. Computer system 280 includes a processor, memory coupled to the processor, and nonvolatile storage such as a hard disk drive.

Figure 3:
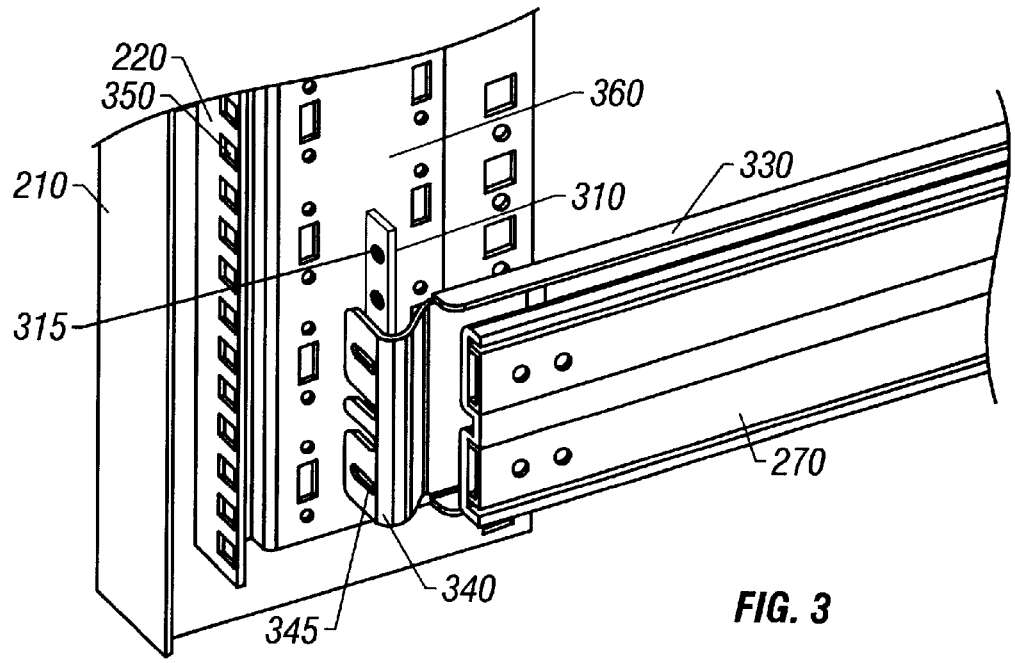
FIG. 3 is a perspective view of portions of components, namely a rack, a recessed slide assembly, and a nut plate, just prior to assembly.

Turning now to FIG. 3, a perspective of a portion of a recessed slide 270 just prior to assembly with a portion of rack 215, and more particularly a portion of front rail 220 of rack 215, is shown. Front rail 220 includes a plurality of rail apertures 350 for insertion of fasteners such as bolts and nuts. Recessed slide 270 includes mounting bracket 330 to which computer system 280 may be attached.

Each mounting bracket 330 includes an attachment flange 340 extending, for example, perpendicularly inward from each end of the base of mounting bracket 330 (the rear attachment flange is not shown in this drawing). Attachment flange 340 may also be curved, as shown, to allow mounting bracket 330 to be flush against front rail 220, and thus allowing for greater room for components within rack 215. Attachment flange 340 includes a plurality of attachment flange apertures 345 used to affix mounting bracket 330 to front rail 220 and to affix back mounting bracket (not shown) to back rail 225 (not shown) using a nut plate 310. Nut plate 310 includes a plurality of nut plate apertures 315 which are threaded to receive one or more corresponding screws (not shown).

Figure 4:
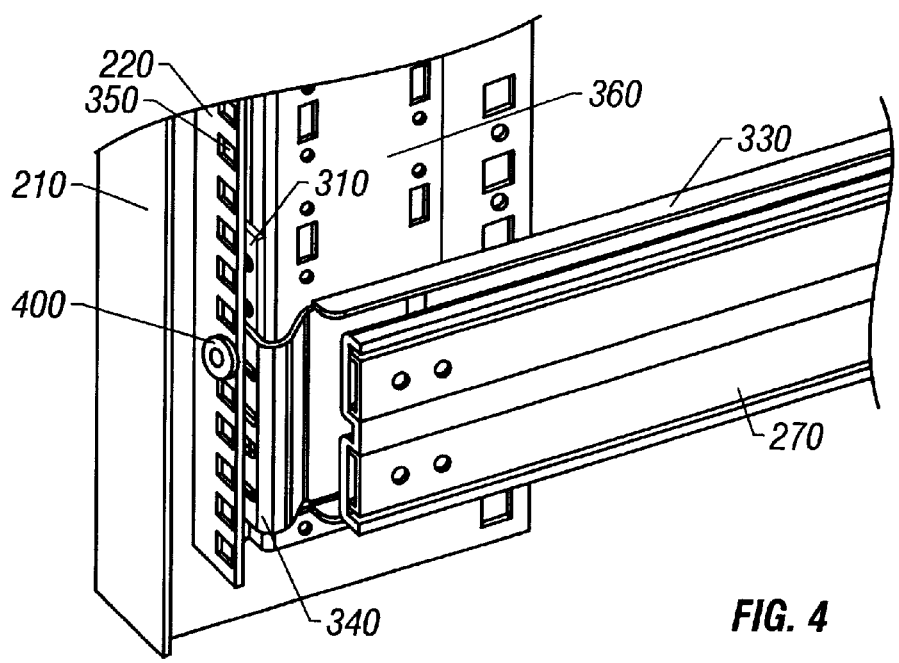
FIG. 4 is a perspective view of portions of components depicted in FIG. 3 with the rack, recessed slide assembly, and nut plate being temporarily secured to one another with a fastener according to the present invention.

Referring now to FIG. 4, a fastener 400 is shown inserted through a rail aperture 350, a mounting bracket aperture 345, and a nut plate aperture 315. Details of fastener 400 are set forth below. Fastener 400 is inserted by hand without the need of a screwdriver or any other type of device. While not shown in FIG. 4, another fastener 400 would be inserted through a back rail aperture, a back mounting bracket aperture, and a second nut plate, so that mounting bracket 330 would be affixed to rack 215 perpendicular to front rail 220, perpendicular to back rail 225, and parallel to the base of rack 215.

Fastener 400 has a tapered or pointed pin (not shown) making it easier to insert the fastener through the apertures. In FIG. 4, fastener 400 is shown as already having been inserted through rail aperture, mounting bracket aperture, and nut plate aperture, so that only the outermost components of the fastener (flange 610 and fastener aperture 620) are visible.

Figure 5:
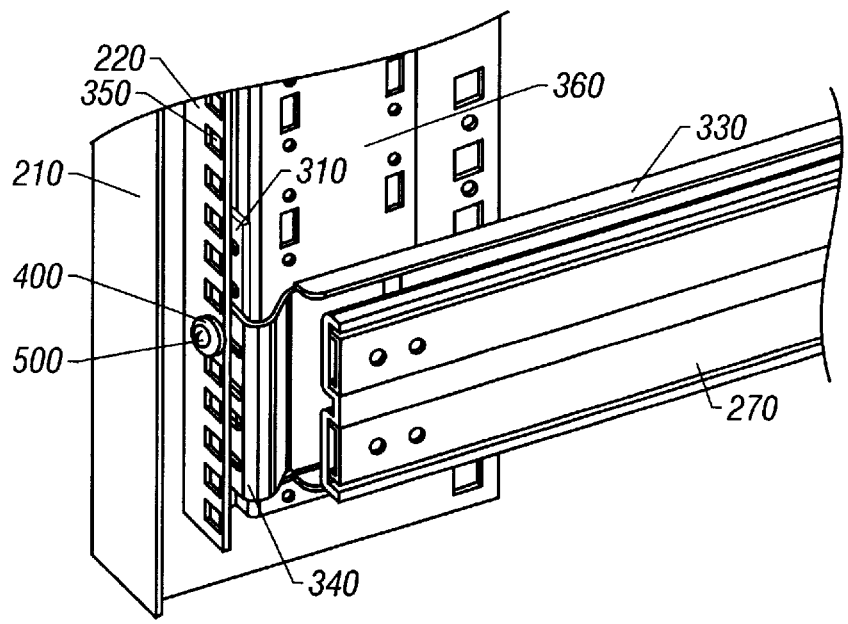
FIG. 5 is a perspective view of portions of components depicted in FIG. 4 with the rack, recessed slide assembly, and nut plate being further secured to one another with a screw which as been inserted through the fastener and engaged with the threads of the corresponding threads on the nut plate.

FIG. 5 is essentially the same as FIG. 4 but shows the addition of screw 500 having been inserted through the aperture in fastener 400 to more securely attach front rail 220, mounting bracket 330, and nut plate 310. The threads on screw 500 correspond to the threads in nut plate 310. As is more easily seen in FIG. 9, insertion of screw 500 causes pin 650 (not shown in FIG. 5) of fastener 400 to break away from sleeve 640 and allow the threads on screw 500 to engage with the threads on nut plate 310.

In one embodiment, fastener 400 is composed of a non-conductive material, such as silicone or nitrile of suitable hardness (approximately 70 to 90 durometers). This allows fastener 400 to be used in electronic and computer installations without the fastener or its components potentially causing electrical shorts or problems with the electronic circuitry.

Figure 6A:
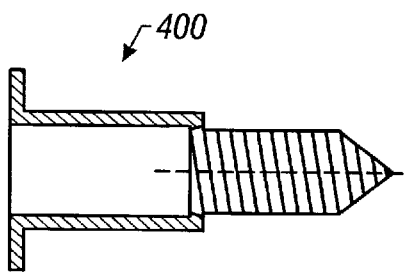
FIG. 6A is a side-view of a fastener according to the present invention.
Figure 6B:
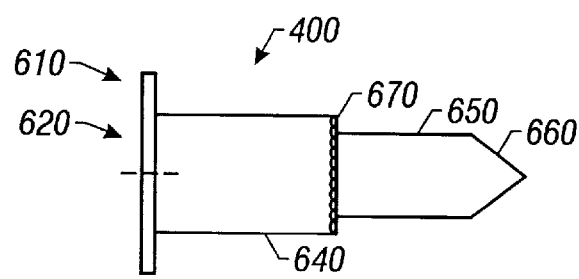

Turning now to FIG. 6A which depicts a side view of fastener 400. FIG. 6B depicts a cross-sectional view of fastener 400 along the line 6B—6B of FIG. 6A. Fastener 400 includes flange 610 surrounding an aperture 620 leading to the interior of a cylindrical sleeve 640. Flange 610 prevents fastener 400 from being completely inserted into an aperture (not shown). Flange 610 further provides a securing mechanism, much like a washer, to prevent a screw from dislodging from fastener 400 once it has been inserted.

A solid pin 650 is coupled to sleeve 640 by juncture 670. The side of pin 650 forms the non-cylindrical boundary of the interior of sleeve 640. In one embodiment, pin 650 is cylindrical in shape with a slightly smaller diameter than the diameter for sleeve 640. In a preferred embodiment, pin 650 is tapered or pointed to form a pin tip 660 for more easily inserting fastener 400 into an aperture. Pin tip 660 is formed on the side of pin 650 furthest from juncture 670 between pin 650 and sleeve 640.

Figure 6C:
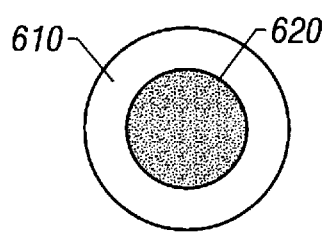
FIG. 6C is a view from the flanged end of the fastener along the line 6C—6C of FIG. 6A according to the present invention.

Turning now to FIG. 6C, a side view of the end of fastener 400 is shown along the line 6C—6C of FIG. 6A. From this perspective, flange 610 and aperture 620 are shown. Aperture 620 serves as the opening to the interior of sleeve 640. A screw or other fastener (not shown) is inserted through aperture 620 to more securely attach the articles.

Figure 7:
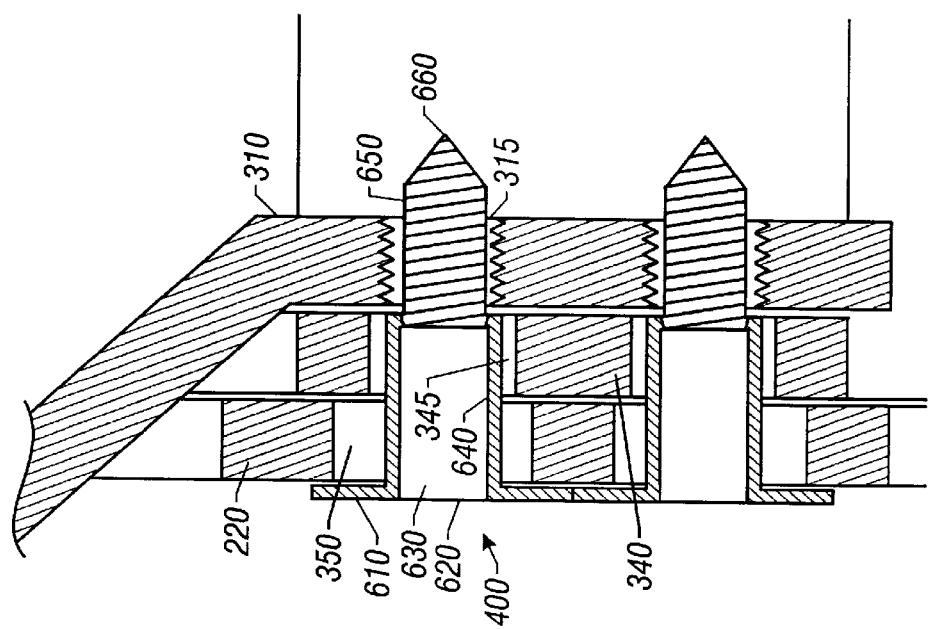
FIG. 7 is a cross-sectional view of two fasteners according to the present invention engaged with the rack, recessed slide assembly, and nut plate.

Referring now to FIG. 7, a cross-sectional view of two fasteners engaged with a front rail 220, attachment flange 340, and nut plate 310 is depicted. Apertures on front rail 220, attachment flange 340, and nut plate 310 may vary in diameter. In this example, the diameter of front rail aperture 350 is greater than the diameter of mounting bracket aperture 345 which, in turn, is greater than the diameter of nut plate aperture 315. The diameter of flange 610 is greater than the diameter of front rail aperture 350 to prevent fastener 400 from being inserted completely within the set of apertures.

Figure 9:
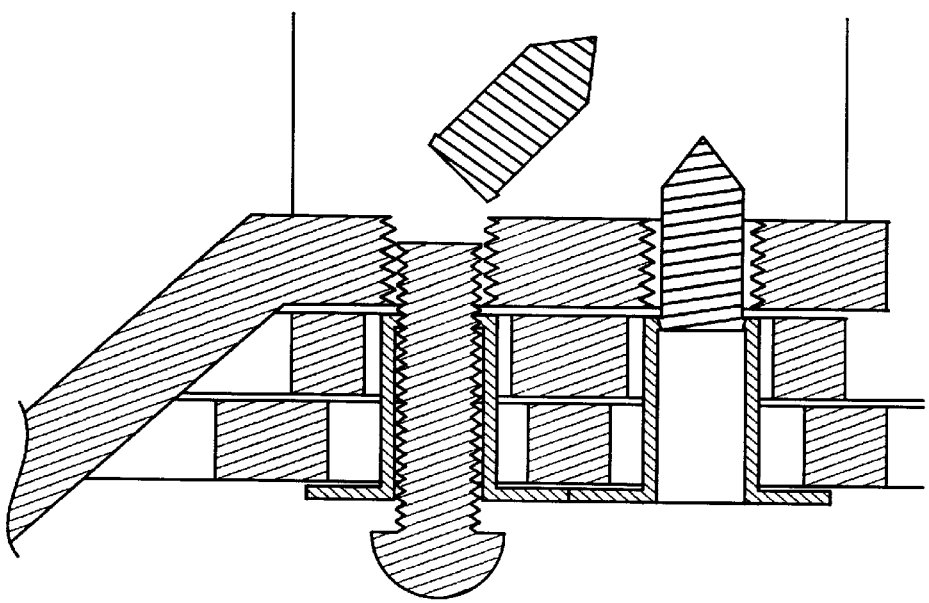
FIG. 9 is a cross-sectional view depicting the screw shown in FIG. 8 being further engaged with the fastener so that the solid pin at the end of the fastener has been removed by the screw and the threads of the screw have engaged with the corresponding threads of the nut plate.

In one embodiment, juncture 670 between sleeve 640 and pin 650 is formed with circumferential break apertures to allow pin 650 to break away from the rest of fastener 400 when a screw 500 is inserted through the interior of sleeve 640. Pressure from screw 500 is applied against the side of pin 650 at the end of the interior portion of sleeve 640. This pressure causes pin 650 to break away from sleeve 640 at juncture 670 and further allows threads on screw 500 to engage with threads on nut plate 310 (as shown in FIG. 9).

In another embodiment, the material coupling sleeve 640 to pin 650 at juncture 670 is sufficiently thin to allow pin 650 to break away from sleeve 640 with only a moderate amount of force. The method used to break pin 650 away from sleeve 640 is largely determined by the material used to form fastener 400 and the industrial application in which fastener 400 is used. For an electronics application, silicone or nitrile of a hardness of approximately 70 to 90 durometers would provide the benefit of having a non-conductive material safe for electronics with a material sufficiently light and inexpensive to manufacture.

Fastener 400 could be formed of silicone or nitrile of a hardness of approximately 70 to 90 durometers and manufactured with tight tolerances so that pin 650 would break away from sleeve 640 without the need for circumferential apertures. Circumferential apertures, on the other hand, would allow for reduced tolerances but would likely be more expensive to manufacture due to the complexity of the manufacturing process to create such apertures. Alternative embodiments for forming juncture 670 include scoring juncture 670 as well as creating juncture 670 from alternative materials known in the art to be sufficiently weak to allow for manual separation of pin 650 from sleeve 640. FIG. 9 depicts pin 650 breaking away from sleeve 640.

In one embodiment, fastener 400 is designed so that the length of sleeve 640 is roughly equal to the combined thickness of front rail 220 and attachment flange 340. The diameter of sleeve 640 is designed to be smaller than the smaller of the diameters of rail aperture 350 and mounting bracket aperture 345. The diameter of flange 610 is designed to be larger than the diameter of the first aperture (either rail aperture 350 or mounting bracket aperture 345) through which fastener 400 is inserted (in the illustrated example, the first aperture would be rail aperture 350).

Pin 650 is designed to engage nut plate 310. In one embodiment, the length of pin 650 is equal to or slightly greater than the thickness of nut plate 310 and the diameter of pin 650 is slightly less than the diameter of nut plate aperture 315. In a preferred embodiment, pin 650 engages with nut plate 310 with sufficient friction to prevent fastener 400 from disengaging with nut plate 310. Pin 650 engages with nut plate 310 in such a way to join rail 220, mounting bracket 330, and nut plate 310.

The tolerances required for pin 650 are determined, in part, by the type of material used for pin 650 and the length of pin 650. In one embodiment, pin 650 is made of silicone or nitrile with a hardness of 70 to 90 durometers. Also in this embodiment, the length of pin 650 is approximately twice the thickness of nut plate 310. In this embodiment, the friction provided by the silicone or nitrile coupled with the length of pin 650 prevents nut plate 310 from disengaging from pin 650 when the diameter of pin 650 is approximately 90% as large as the diameter of nut plate aperture 315.

In an alternative embodiment, the diameter of pin 650 closer in size to the diameter of nut plate aperture 315. This embodiment ensures that nut plate aperture 315 aligns properly with the interior of sleeve 640. Proper alignment is important to initiate engagement of screw 500 with nut plate 310 once pin 650 has broken away from fastener 400.

An alternative embodiment is shown in FIG. 7 where two fasteners 400 are coupled to one another by a common flange 700. In a manufacturing process, upper and lower screws are often engaged with front rail 220, attachment flange 340, and nut plate 310. To increase assembly efficiency, sets of fasteners can be coupled to one another for known applications. In this way, a set of coupled fasteners 400 can be inserted into the assembly in one step saving additional time, providing additional strength to the attachment, and aligning the components correctly.

Figure 8:
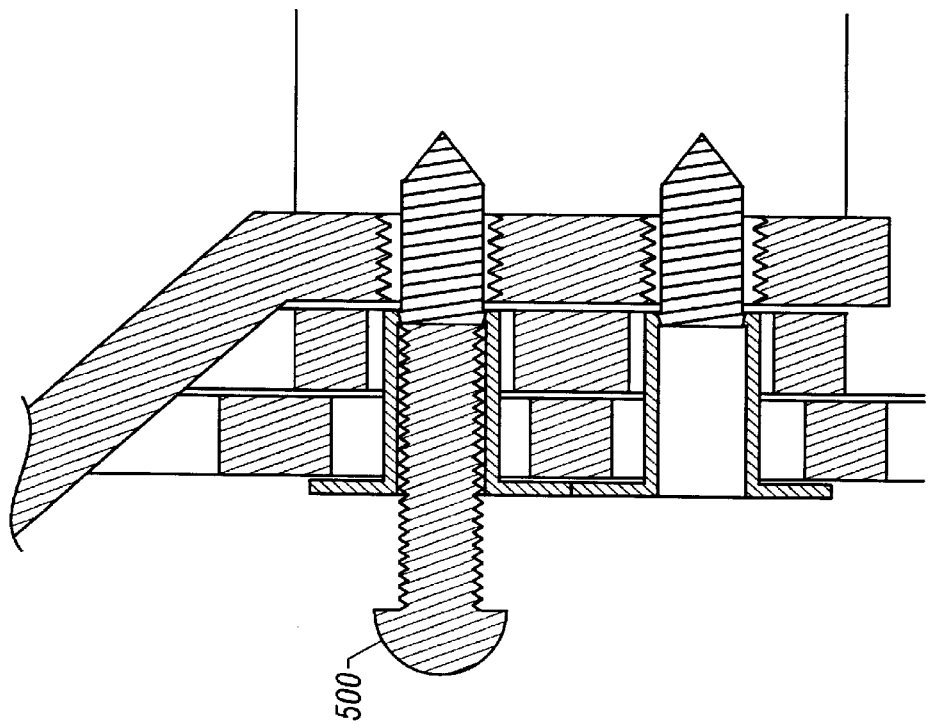
FIG. 8 is a cross-sectional view depicting a screw being inserted into the upper fastener as illustrated in FIG. 7.

Turning now to FIGS. 8 and 9, the insertion of a screw 500 into sleeve 640 of fastener 400 is shown. In FIG. 8, screw 500 is inserted, either by hand or with use of a screwdriver, into sleeve 640. When the assembler further engages screw 500 with a screwdriver or similar device into sleeve 640, additional force is supplied, both along the axis of sleeve 640 and rotationally against the back of sleeve 640 against pin 650. This additional force causes pin 650 to break away from sleeve 640.

Pin 650 is shown having a slightly smaller diameter than the diameter of nut plate aperture 315. As previously explained, it is important for the diameter of pin 650 to correspond with nut plate aperture 315 to provide for engagement of screw 500 with threads on nut plate 310.

As shown in FIG. 9, pin 650 breaks away from fastener 400 allowing the threads of screw 500 to engage with the corresponding threads in nut plate aperture 315. In addition, it can be seen that flange 610 will act as a washer to prevent screw 500 from disengaging from the assembly. Also evident is the friction which may exist between the interior walls of sleeve 640 and the threads of screw 500. This friction also works to prevent screw 500 from dislodging from fastener 400 once screw 500 has been engaged with fastener 400.

Figure 10:
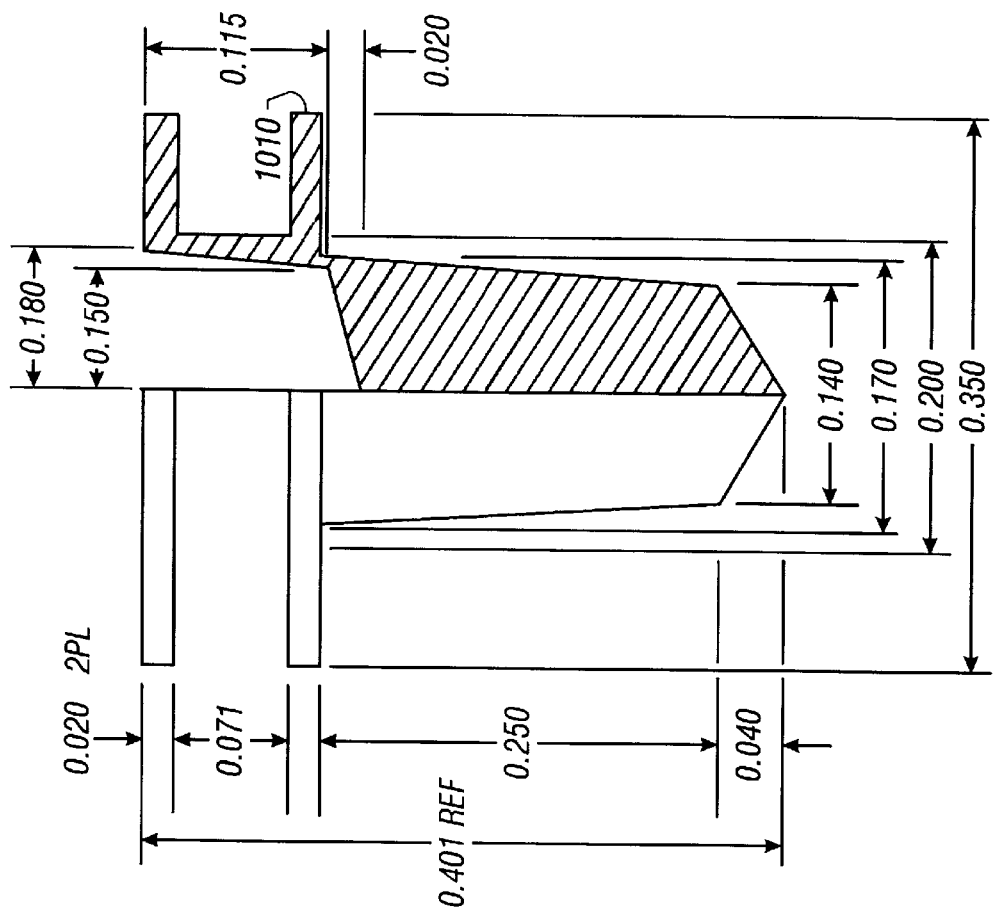
FIG. 10 is a side and cross-sectional view of a fastener with a secondary flange for more securely engaging the fastener with the articles.

Finally, turning to FIG. 10, where an alternative embodiment of a fastener 400 is depicted. In this embodiment, a second flange 1010 is shown extending perpendicularly from sleeve 640 and parallel to flange 610. Second flange 1010 is made out of a flexible material, such as silicone or nitrile of approximately 70 to 90 durometers, which can bend and compress back allowing it to pass through apertures in components (such as rail aperture 350 and mounting bracket aperture 345 discussed above). After being inserted past the apertures, second flange 1010 flexes back to its original position perpendicular with sleeve 640. In this position, second flange 1010 holds fastener 400 in place and prevents fastener from being accidentally removed or otherwise disengaged from the assembly. FIG. 10 shows an embodiment for a computer system application with measurements for the taper of pin 650, taper of pin tip 660, and taper of sleeve 640. Flange 610 and second flange 1010 are both shown with a diameter of 0.350 inches and a thickness of 0.020 inches. The distance from Flange 610 and second flange 1010 is shown as being 0.071 inches. Sleeve 640 is shown as tapering from an interior diameter of 0.180 inches at aperture 620 to a smaller interior diameter of 0.150 inches at end of sleeve 640. The outer diameter of sleeve 640 is shown as being 0.200 inches and the length of the interior of sleeve 640 is shown as being 0.115 inches long. Pin is shown as tapering from a diameter of 0.170 inches at the juncture between pin 650 and sleeve 640 to a diameter of 0.140 inches at the beginning of pin tip 660 along a length of 0.250 inches. Pin tip 660, in turn, tapers from a diameter of 0.140 inches to a point along a length of 0.040 inches. The overall length of fastener 400 is shown as being 0.401 inches. Juncture 670 between sleeve 640 and pin 650 is shown as being 0.020 inches thick (0.170 in.–0.150 in.). In FIG. 10, juncture 670 is designed to be thin enough to allow manual pressure to break pin 650 away from sleeve 640 without the need for circumferential break apertures or other such structures to weaken the coupling between sleeve 640 and pin 650.

The description of the invention set forth herein is illustrative and not intended to limit the scope of the invention as set forth in the following claims. Variations and modifications of the embodiments disclosed herein may be made based on the descriptions set forth herein, without departing from the scope and spirit of the invention as set forth in the following claims.

What is claimed is:

1. A computer system comprising:
   a processor, memory coupled to the processor, a nonvolatile storage unit, and;
   a computer enclosure including:
   a front and a back rail each in a vertical fixed position parallel with one side of the computer enclosure, each rail having a plurality of apertures therein;
   a horizontal slide assembly having a front and a back mounting bracket connected by a horizontal slide rail, the front and the back mounting bracket each having a plurality of apertures therein and each extending perpendicularly from the horizontal slide rail with a distance between the front mounting bracket and the back mounting bracket being roughly equivalent to a distance between the front rail and the back rail;
   a front and a back nut plate each with a plurality of threaded apertures therein;
   wherein a front assembly comprises the front rail, the front mounting bracket, and the front nut plate and a back assembly comprises the back rail, the back mounting bracket, and the back nut plate;
   the front assembly being joined by aligning one aperture on the front rail with one aperture on the front mounting bracket and one aperture on the front nut plate and inserting a fastener through the aligned apertures, the fastener including:
     a flange, when the flange is inserted into the front assembly, the flange is contiguous with the front assembly and the flange prevents the fastener from completely entering the front assembly;
     a sleeve coupled to the flange at one end of the sleeve;
     a pin coupled to an end of the sleeve opposite to the end of the sleeve coupled to the flange; and
     a juncture between the sleeve and the pin wherein the juncture is responsive to pressure exerted on the pin which causes the pin to de-couple from the sleeve.

2. The fastener as recited in claim 1, wherein the outer diameter of the pin is slightly smaller than the diameter of the threaded aperture in the nut plate.

3. The fastener as recited in claim 1, wherein the fastener is comprised of nonconductive material.

4. The fastener as recited in claim 1, wherein the fastener is comprised of silicone or nitrile.

5. The fastener as recited in claim 1, wherein the fastener has a hardness between 70 and 90 durometers.

6. The fastener as recited in claim 1, wherein the back assembly is joined by aligning one aperture on the back rail with one aperture on the back mounting bracket and with one aperture on the back nut plate and inserting the fastener through the aligned apertures.

7. The fastener as recited in claim 1, wherein a second flange extends perpendicularly outward from the sleeve and parallel to the flange.

8. The subject matter of claim 1, in which a second fastener is engaged with the fastener causing the pin to de-couple from the fastener.

9. A rack-mounted system for temporarily joining articles with aligned apertures, said rack-mounted system comprising:
   an enclosure including:
   a front and a back rail each in a vertical fixed position parallel with one side of the enclosure, each rail having a plurality of apertures therein;
   a horizontal slide assembly having a front and a back mounting bracket connected by a horizontal slide rail, the front and the back mountain bracket each having a plurality of apertures therein and each extending perpendicularly from the horizontal slide rail with a distance between the front mounting bracket and the back mounting bracket being roughly equivalent to a distance between the front rail and the back rail;
   a front and a back nut plate each with a plurality of threaded apertures therein;
   wherein a front assembly comprises the front rail, the front mounting bracket, and the front nut plate and a back assembly comprises the back rail, the back mounting bracket, and the back nut plate;
   the front assembly being joined by ailing one aperture on the front rail with one aperture on the front mounting bracket and one aperture on the front nut plate and inserting a fastener through the aligned apertures, the fastener including:
     a flange, when the flange is inserted into the front assembly, the flange is contiguous with the front assembly and the flange prevents the fastener from completely entering the front assembly;
     a sleeve coupled to the flange at one end of the sleeve;
     a pin coupled to an end of the sleeve opposite to the end of the sleeve coupled to the flange; and
     a juncture between the sleeve and the pin wherein the juncture is responsive to pressure exerted on the pin which causes the pin to de-couple from the sleeve.

10. The fastener as recited in claim 9, wherein the pressure exerted on the juncture is supplied by a second fastener inserted through the sleeve.

11. The fastener as recited in claim 9, wherein the pin is engaged with an aperture in an article.

12. The fastener as recited in claim 9, wherein the pin is tapered such that the diameter of the pin at the location where the pin is coupled to the sleeve is greater than the diameter of the end of the pin opposite to the end of the pin coupled to the sleeve.

13. The fastener as recited in claim 9, wherein the diameter of the pin is less than the diameter of the sleeve.

14. The fastener as recited in claim 9, wherein the fastener is comprised of nonconductive material.

15. The fastener as recited in claim 9, wherein the fastener is comprised of silicone or nitrile.

16. The fastener as recited in claim 9, wherein the fastener has a hardness between 70 and 90 durometers.

17. The fastener as recited in claim 9, wherein the juncture is comprised of a plurality of circumferential apertures for weakening the coupling between the sleeve and the pin.

18. The fastener as recited in claim 9, wherein the length of the sleeve is slightly smaller than the combined thickness of the front rail and the front mounting bracket.

19. The fastener as recited in claim 9, wherein a second flange extends perpendicularly outward from the sleeve parallel to the flange and the second flange further engages the articles by compressing and inserting through the plurality of aligned apertures and decompressing with a diameter greater than the diameter of the aligned aperture nearest to the second flange to prevent the fastener from disengaging from the articles.

20. The subject matter of claim 9, in which a second fastener is inserted through the fastener; the sleeve and the flange portions of the fastener remaining with the rack-mounted enclosure and the pin portion of the fastener decoupling from the sleeve portion of the fastener.

21. A method of joining articles with aligned apertures in a rack-mounted system, said rack-mounted system comprising an enclosure including a front and a back rail each in a vertical fixed position parallel with one side of the enclosure, each rail having a plurality of apertures therein; a horizontal slide assembly having a front and a back mounting bracket connected by a horizontal slide rail, the front and the back mounting bracket each having a plurality of apertures therein and each extending perpendicularly from the horizontal slide rail with a distance between the front mountain bracket and the back mounting bracket being roughly equivalent to a distance between the front rail and the back rail; a front and a back nut plate each with a plurality of threaded aperes therein; wherein a front assembly comprises the front rail, the front mounting bracket, and the front nut plate and a back assembly comprises the back rail, the back mounting bracket, and the back nut plate, said method comprising:

aligning one aperture on the front rail with one aperture on the front mounting bracket and one aperture on the front nut plate to form the front assembly;

inserting a fastener through the aligned apertures, the fastener including:
  a flange, the flange having an outer diameter preventing the fastener from completely entering the articles through the aligned apertures;
  a sleeve coupled to the flange at one end of the sleeve;
  a pin coupled to an end of the sleeve opposite to the end of the sleeve coupled to the flange; and
  a juncture between the sleeve and the pin wherein the juncture is responsive to pressure;
  inserting a second fastener through the sleeve; and
  de-coupling the pin from the fastener by pressing the second fastener against the pin.

22. The method as recited in claim 21, wherein the pressure exerted on the pin is supplied by a threaded fastener which has been inserted through the sleeve.

23. The method as recited in claim 21, wherein the juncture is comprised of a plurality of circumferential apertures for weakening the coupling between the sleeve and the pin.

24. The method as recited in claim 21, wherein the fastener further includes a second flange extending perpendicularly outward from the sleeve and parallel to the flange wherein the second flange is inserted through one or more of the apertures to prevent the fastener from disengaging from the articles.

* * * * *

UNITED STATES PATENT AND TRADEMARK OFFICE
CERTIFICATE OF CORRECTION

PATENT NO.    : 6,052,274
ISSUE DATE    : April 18, 2000
INVENTOR(S)   : Remsburg, Ralph It is certified that error appears in the above-identified patent and that said Letters Patent is hereby corrected as shown below:

Col. 9, line 30, delete "aperes" and insert --apertures--.

Signed and Sealed this

Third Day of April, 2001

*Attest:*

NICHOLAS P. GODICI

*Attesting Officer*    Acting Director of the United States Patent and Trademark Office